(12) United States Patent
Nakasuji

(10) Patent No.: US 6,352,799 B1
(45) Date of Patent: Mar. 5, 2002

(54) CHARGED-PARTICLE-BEAM PATTERN-TRANSFER METHODS AND APPARATUS INCLUDING BEAM-DRIFT MEASUREMENT AND CORRECTION, AND DEVICE MANUFACTURING METHODS COMPRISING SAME

(75) Inventor: Mamoru Nakasuji, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/515,988

(22) Filed: Mar. 1, 2000

(30) Foreign Application Priority Data

Mar. 3, 1999 (JP) ............................................ 11-054923

(51) Int. Cl.$^7$ .............................. G03F 9/00; G03C 5/00
(52) U.S. Cl. .............................. 430/5; 430/30; 430/296; 430/942; 250/492.22; 250/492.3
(58) Field of Search .............................. 430/5, 30, 296, 430/942; 250/492.22, 492.3

(56) References Cited

PUBLICATIONS

Kato et al., "Beam Position Stabilization by Suppression of Electrons Reentering the Electron–Beam Column," *J. Vac. Sci. Technol.* 13:2450–2454 (1995).

*Primary Examiner*—Christopher G. Young
(74) *Attorney, Agent, or Firm*—Klarquist Sparkman LLP

(57) ABSTRACT

Charged-particle-beam microlithography methods and apparatus are disclosed that employ a segmented reticle and provide high-accuracy pattern transfer even under conditions of drift of the charged particle beam. Beam-drift test patterns are defined on a reticle at the termini of deflection fields at one or both lengthwise ends of certain reticle stripes. Corresponding beam-test marks are situated on or at the wafer. A charged particle beam passing through a beam-test pattern on the reticle is a "detection beam" that is directed to and scanned over the corresponding beam-test mark on the wafer. Before performing actual pattern transfer, the beam-test marks on the wafer are scanned by the detection beam passing through the corresponding beam-drift test patterns on the reticle, and electrons emitted by impingement of the detection beam on the wafer beam-test marks are detected. The positions of the beam-test marks are detected multiple times and the corresponding data is used to measure beam drift. The beam-drift measurements provide data usable to perform a correction of the beam position so as to reduce or eliminate effects of beam drift.

21 Claims, 6 Drawing Sheets

CHARGED-PARTICLE-BEAM PATTERN-TRANSFER METHODS AND APPARATUS INCLUDING BEAM-DRIFT MEASUREMENT AND CORRECTION, AND DEVICE MANUFACTURING METHODS COMPRISING SAME

FIELD OF THE INVENTION

This invention pertains to microlithography (pattern projection and transfer from a mask or reticle to a substrate) as used in the manufacture of semiconductor integrated circuits and displays. More specifically, the invention pertains to microlithography using a charged particle beam (e.g., electron beam or ion beam) to transfer a circuit pattern or the like to a substrate (e.g., semiconductor wafer) at a resolution (minimum linewidth) of 0.1 µm or less on the substrate.

BACKGROUND OF THE INVENTION

As feature sizes in circuit patterns for integrated circuits, displays, and the like progressively have been miniaturized, the resolution limits of optical microlithography have become increasingly apparent. This has resulted in intensive efforts to develop practical microlithography apparatus and methods exploiting an exposure technology offering prospects of substantially greater resolution than obtainable using optical microlithography. Optical microlithography utilizes a beam of light (typically ultraviolet light) as a pattern-transfer energy beam. One candidate alternative technology to optical microlithography involves the use of a charged particle beam (e.g., electron beam or ion beam) rather than a light beam as an energy beam.

Whereas charged-particle-beam (CPB) microlithography (e.g., electron-beam microlithography) offers prospects of high resolution, many technical problems must be solved in order to develop practical CPB microlithography apparatus and methods. One technical problem pertains to beam drift, i.e., changes in actual beam position relative to desired beam position. As can be surmised, in order to achieve a pattern-feature resolution on the order of 0.1 µm or less, the position of a charged particle beam as used for pattern transfer must be controlled extremely accurately and precisely. If beam drift is excessive, then the "CPB optical system" (i.e., assembly of "lenses", deflectors, and the like for shaping and guiding the beam from a source to the substrate) conventionally must be disassembled, cleaned, and reassembled.

Most instances of beam drift arise from the accumulation of contaminants in the CPB optical system. Deposits of contaminants in a CPB optical system tend to accumulate static charges that can have a significant electrostatic effect on the beam. I.e., propagation of the beam past contaminant deposits presenting an unwanted electrostatic charge to the beam can cause the beam to be deflected or distorted in undesirable ways. Some causes of beam drift can be attributed to parameters that can be controlled in the optical system such as variations in lens-induction current, deflection current, voltage, temperature, and the like. Nevertheless, beam drift (especially beam drift caused by factors that cannot be controlled directly) remains an important problem requiring effective solution.

Whereas the beam current in certain types of CPB microlithography apparatus (specifically, conventional electron-beam "variable-shaped beam apparatus") is usually small (approximately 1 µA or less), a beam current of, e.g., 20 times greater (i.e., 20 to 25 µA) is used in other types of apparatus such as "divided-pattern" CPB microlithography. Exposure of a resist on the surface of a wafer with these higher beam currents typically generates large amounts of volatile by-products of the resist. The volatile by-products tend to deposit in various locations inside the CPB optical system, and the rate of deposition tends to increase with increases in beam current. To achieve and maintain maximal resolution of pattern transfer, beam stability (freedom from significant drift) must be maintained at a high level. However, to maintain such stability at high beam currents, affected components of the CPB optical system must be disassembled and cleaned progressively more frequently. In addition, especially at higher beam currents, resulting variations in temperature of the components in the CPB optical system can cause significant beam drift, even in instances in which the CPB optical system is not "dirty."

SUMMARY OF THE INVENTION

This invention addresses these problems and its purpose is to provide, inter alia, methods for realizing high-precision pattern transfer, even when there is a certain amount of beam drift.

A charged-particle-beam CPB) microlithography ("projection-transfer" or "projection-exposure") system according to the invention employs a reticle in which the pattern field is divided or "segmented" into multiple portions defining respective portions of the pattern. More specifically, the pattern field is divided into multiple "stripes" that are typically rectangular in shape. Each stripe has a width (shorter dimension) that is within the deflectable field of the CPB optical system. Each stripe is divided further into multiple parallel "deflection fields" each having a length extending the width of the stripe. The overall pattern field is transferred stripe-by-stripe and each stripe is transferred deflection-strip-by-deflection-strip. To transfer a stripe, the charged particle beam is deflected, in a scanning manner, across the width of the stripe to scanningly expose each deflection field. As each deflection field is exposed, the reticle and substrate are mechanically displaced as required (in the length dimension of the stripe) to bring the next deflection field into position for exposure.

The reticle includes beam-drift test patterns in certain deflection fields (a beam-drift test pattern desirably is located in a terminus of the respective deflection field) that is scanned by the charged particle beam (functioning as a "detection beam"). Corresponding beam-test marks are disposed on or at a substrate in locations where the respective test-pattern-containing deflection fields will be exposed by the charged particle beam. The beam-test marks on the substrate are irradiated scanningly by the detection beam (passing through corresponding beam-test patterns on the reticle) prior to pattern transfer. The positions of the test patterns are detected (desirably iteratively) by scanning the corresponding beam-test marks on the substrate multiple times with the detection beam passing through the corresponding beam-drift test patterns on the reticle, thereby providing positional data for detecting beam drift. From such positional data, the magnitude and directions of corrective deflections to the beam are calculated. The beam position during subsequent pattern transfer is corrected according to the results of these calculations to correct the beam drift and achieve a more accurate pattern transfer.

Whenever the charged particle beam is being used constantly under identical conditions, the magnitude of beam drift over time tends to be minimal. On the other hand, comparatively large beam drifts tend to occur whenever beam parameters are changed. For example, substantial beam drift can occur immediately after resuming use of a beam that has been "blanked" for a long period of time. Substantial beam drift also can occur whenever the beam current is suddenly and substantially changed from a high beam current to a low beam current, for example, or immediately after the beam is subjected to a large deflection. Even though such drifts are regarded as irregular, a degree of repeatability can be discerned in them under similar beam parameters.

In CPB microlithography apparatus that perform pattern transfer using reticles having identical specifications, essentially the same exposure operations normally are repeated at locations on the reticle at which the beam is either blanked or deflected, but not at locations on the reticle at which the beam current normally changes with a change in the pattern. Similar magnitudes and directions of the beam drift tend to be evident at the respective repeated locations. By correcting these repeatable components of beam drift, it is possible to perform high-accuracy pattern transfer even when there is a small residual amount of beam drift.

According to the invention, changing ratios of beam drift or simple differences in beam drift observed in various deflection fields can be measured and tabulated in advance using a test reticle defining a beam-drift test pattern in multiple deflection fields. Also, a test substrate can be used that possesses corresponding beam-test marks in respective regions on the substrate corresponding to the deflection fields on the reticle. Actual pattern transfer can be performed after storing these data (after replacing the test reticle and test substrate with an actual transfer reticle and substrate). During such exposure, beam drift is corrected based on the pre-tabulated ratios or differences.

Alternatively to using a test reticle and test substrate, it is possible to dispose beam-drift test patterns on a region of a normal patterned reticle and corresponding beam-test marks on a corresponding region of an actual wafer. In such a situation, beam drift can be measured in real time during actual pattern transfer. In any event, with a CPB microlithography apparatus used full time for semiconductor device fabrication, it is desirable to measure beam drift on a regular basis, such as at least once a week, using a dedicated test reticle and test wafer. The results of such periodic tests desirably are tabulated and used to perform corrections, as required, of beam drift during the remaining time the apparatus is used. By using a dedicated test reticle, more of an actual production reticle can be used for defining the pattern to be transferred to wafers for actual device manufacture.

It is also desirable for the feature density in the deflection fields containing the beam-drift test pattern or in the corresponding beam-test marks on the substrate to be substantially equal to the average feature density of an actual device pattern to be transferred.

Whenever beam current is high, the magnitude of beam drift tends to be correspondingly larger, and the opposite is experienced whenever the beam current is low. Nevertheless, beam drift can be measured under test conditions that are nearly identical to conditions during actual device-pattern transfer, and beam-drift correction under such conditions can be performed very accurately. Beam drift also can be measured while changing the beam current to various levels of magnitude, and the beam-drift correction can be calculated as a function of the beam current. Since beam current and drift magnitude may not be proportional, drift magnitude alternatively can be determined by interpolating from a mid-range value of beam current.

A CPB microlithography (pattern-transfer exposure) apparatus according to the invention comprises an illumination-optical system situated and configured to illuminate a reticle defining features of a pattern to be transferred to a sensitive substrate. The reticle is mounted on a movable reticle stage and illuminated with an "illumination beam." The apparatus also comprises a projection-optical system situated and configured to project and form an image of the portion of the illumination beam (that has passed through the illuminated portion of the reticle and become a "patterned beam") onto a desired location on the sensitive substrate. The substrate is mounted on a movable substrate stage.

A reticle according to the invention comprises a pattern-transfer field that is divided into multiple stripes, and each stripe is divided into multiple deflection fields. Each deflection field can comprise multiple subfields. Each stripe has a length dimension and a width dimension. The width dimension corresponds to the maximal lateral deflection that can be imparted to the illumination beam by the illumination-optical system of the CPB microlithography system with which the reticle is used. Each stripe is further divided into multiple strip fields (deflection fields) that extend in the direction of the width dimension of the respective stripe.

The overall pattern-transfer field of the reticle is transferred to the substrate by deflecting and scanning the illumination beam in the direction of the width dimension of the stripes (to sequentially expose the deflection fields), while mechanically scanning (using the respective stages) the reticle and the sensitive substrate in the direction of the length dimension of the stripes (to sequentially move deflection fields into position for exposure).

A beam-drift test pattern is defined on the reticle in a deflection field at the lengthwise end of a stripe. Similarly, a corresponding beam-test mark (to be irradiated with the detection beam passing through the corresponding beam-drift test pattern on the reticle) is defined on the substrate. The apparatus includes a beam-drift-correction unit that, before pattern transfer begins, detects the positions of the beam-drift test patterns multiple times by scanning the beam-test marks on the substrate with the detection beam passing through corresponding beam-drift test patterns on the reticle. The beam-drift-correction unit iteratively determines the magnitude of beam drift, calculates the amount of required correction of the beam position, and imparts the required correction to the beam position as required during actual pattern transfer, based on the measured magnitude and direction of beam drift.

The foregoing and additional features and advantages of the invention will be more readily apparent from the following detailed description, which proceeds with reference to the accompanying drawings.

BRIEF DESCRIPTION OF THE DRAWINGS

FIGS. 5(A)–5(C) schematically depict certain features of a representative embodiment of a reticle according to the invention, as used for electron-beam microlithography, wherein FIG. 5(A) is a plan view of the overall reticle, FIG. 5(B) is a partial oblique view of the reticle, and FIG. 5(C) is a plan view of a single subfield of the reticle.

DETAILED DESCRIPTION

Figure 4:
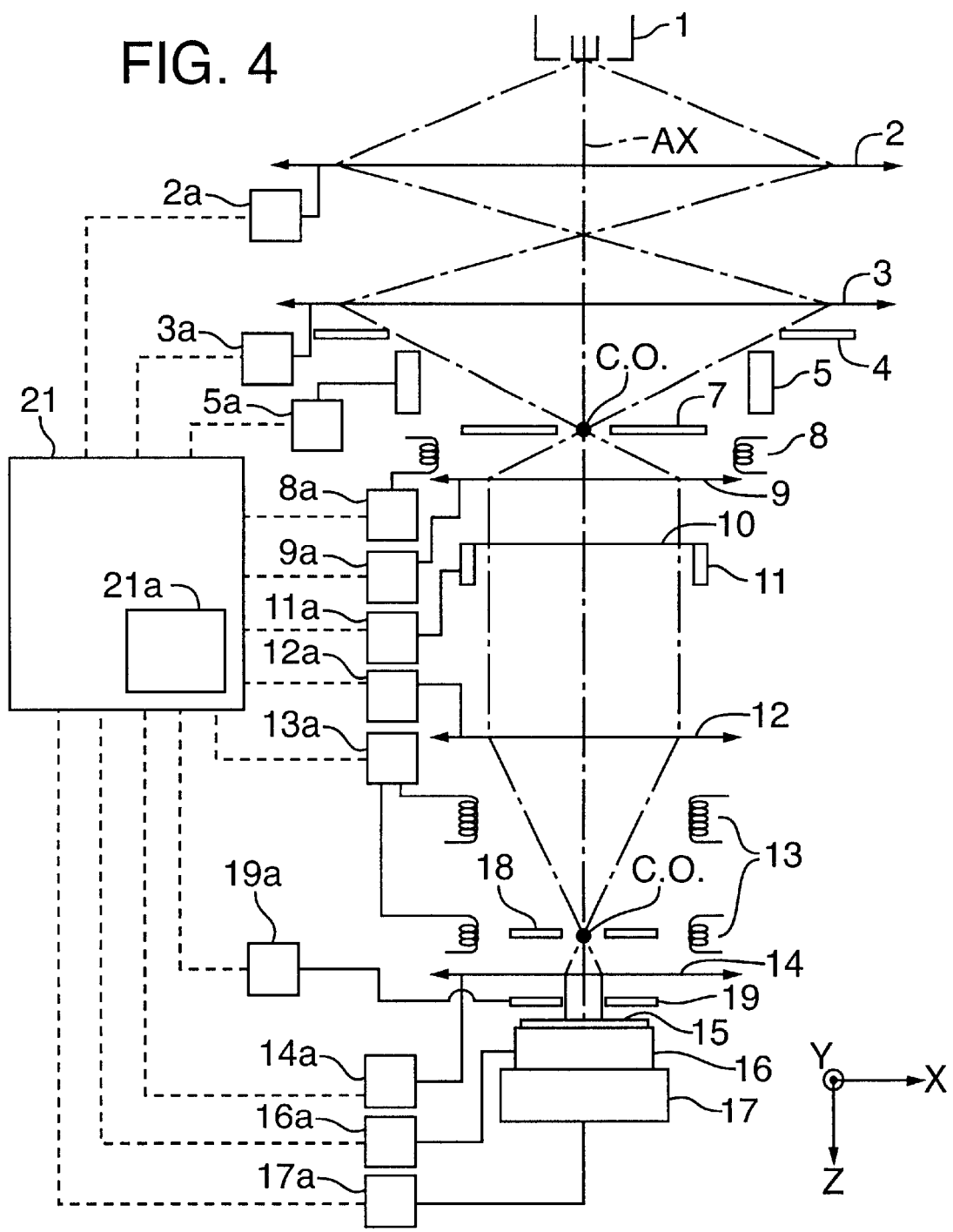
FIG. 4 is a schematic elevational view of various components, imaging relationships, and control systems of an electron-beam microlithography apparatus according to a representative embodiment of the invention.

Reference is first made to FIG. 4 that depicts an overall configuration of a representative embodiment of a CPB microlithography apparatus according to the invention. FIG. 4 also depicts certain imaging and control relationships of the CPB optical system of the apparatus. FIG. 4 is depicted and discussed in the context of an electron-beam system. However, it readily will be understood that the general principles discussed below can be applied with equal facility to an ion-beam system or the like.

An electron gun 1 is situated at the extreme upstream end of the optical system of FIG. 4. The electron gun 1 emits an electron beam (termed the "illumination beam") in a downstream direction (downward in the figure) along an optical axis AX. A two-stage condenser-lens assembly (comprising first and second condenser lenses 2, 3, respectively) is situated downstream of the electron gun 1. The illumination beam passes through the condenser lenses 2, 3 and forms a crossover image C.O. at a blanking aperture 7.

A beam-shaping aperture 4 is situated downstream of the second condenser lens 3. The beam-shaping aperture 4 has a transverse profile (usually square or rectangular) that trims and shapes the illumination beam to have a transverse profile and dimensions sufficient to illuminate only one "subfield" on a downstream reticle 10. A "subfield" is a unit of the reticle pattern that is exposed at any instant of time during exposure of the pattern, and thus represents an "exposure unit" of the reticle 10. By way of example, the beam-shaping aperture 4 trims the illumination beam to have a square transverse profile measuring just over 1 mm on each side as illuminated on the reticle. An image of the beam-shaping aperture 4 is formed on the reticle 10 by a third condenser lens 9.

The blanking aperture 7 is defined by a plate that, except for the illumination beam allowed to pass through the actual blanking aperture, blocks the illumination beam. A blanking deflector 5 is situated between the beam-shaping aperture 4 and the blanking aperture 7. The blanking deflector 5 deflects the illumination beam to strike the plate of the blanking aperture 7 (thereby blocking the illumination beam from propagating further downstream) whenever the illumination beam is to be prevented from propagating to the reticle 10.

A subfield-selection deflector 8 is situated downstream of the blanking aperture 7. The subfield-selection deflector 8 illuminates each subfield on the reticle 10 within the field of the illumination-optical system by sequentially or continuously scanning the illumination beam primarily in the left-right direction in FIG. 4 (i.e., in the X-direction). The third condenser lens 9, situated downstream of the subfield-selection deflector 8, collimates the illumination beam for impingement on the reticle. Thus, the illumination beam forms an image of the beam-shaping aperture 4 on the reticle 10 whenever the illumination beam strikes the reticle 10.

Even though only one subfield of the reticle 10 is shown (the depicted subfield is centered on the optical axis AX in FIG. 4), it will be understood that the reticle 10 actually comprises multiple subfields arrayed within the X-Y plane extending perpendicularly to the optical axis AX. The reticle 10 normally defines the entire pattern of, for example, a layer of a semiconductor-device chip to be transferred to a substrate ("wafer") 15. Because the reticle 10 is divided into subfields, it is a socalled "divided" or "segmented" reticle. Further detail regarding the configuration of the reticle is presented later.

The illumination beam is deflected as required by the subfield-selection deflector 8, as discussed above, to illuminate the subfields sequentially or continuously within the field of the illumination-optical system.

The optical components (lenses and deflectors) discussed above that are situated between the electron gun 1 and the reticle 10 are regarded as components of the "illumination-optical system."

The reticle 10 is mounted on a reticle stage 11 to facilitate mechanical movement of the reticle as required in the X- and Y-directions during exposure of the pattern. Thus, subfields located outside the optical field of the illumination-optical system can be moved to within the optical field.

The FIG. 4 apparatus also comprises first and second projection lenses 12, 14, respectively, and a deflector 13 situated downstream of the reticle 10. As the illumination beam strikes a particular subfield on the reticle 10, the portion of the illumination beam passing through the illuminated subfield and propagating downstream of the reticle 10 is denoted the "patterned beam." This is because the beam downstream of the reticle is "patterned" by passing through regular pattern features or test-pattern features defined in the illuminated subfield and thus acquires the ability to form an image, downstream of the reticle 10, of the illuminated features. The projection lenses 12, 14 act in concert on the patterned beam to prepare the beam for forming the image on the upstream-facing surface of the wafer 15. As the projection lenses 12, 14 converge the patterned beam onto the wafer 15, the image carried by the patterned beam is "reduced" (demagnified) for projection onto the wafer 15. By "reduced" or "demagnified" is meant that the image as formed on the wafer 15 is smaller (by an integer reciprocal factor termed the "demagnification ratio") than the corresponding illuminated area on the reticle 10. For each subfield on the reticle 10, the corresponding image is formed at a specified respective location on the wafer 15.

For imprinting of the images on the wafer surface, the upstream-facing surface of the wafer 15 is coated with a suitable "resist." Portions of the resist that receive a dose of charged particles in the patterned beam undergo a latent chemical change that is "developed" to reveal the image. A wafer or substrate coated with a non-developed resist is termed "sensitive."

A second crossover C.O. is formed at an axial location at which the axial distance from the reticle 10 and the wafer 15 is divided according to the demagnification ratio. A contrast aperture 18 is located at this second crossover. The contrast aperture 18 blocks electrons of the patterned beam that have been scattered by passing through or by non-patterned areas of the reticle 10. Thus, such scattered electrons do not propagate to the wafer 15.

The optical components (lenses and deflectors) discussed above that are situated between the reticle 10 and the wafer 15 are regarded as components of the "projection-optical system."

A backscattered-electron (BSE) detector 19 is situated between the second projection lens 14 and the wafer 15. The BSE detector 19 detects electrons emitted when the patterned beam strikes the wafer 15 (which causes some of the electrons of the patterned beam to be emitted in an upstream direction from the wafer 15. The BSE detector 19 produces an electrical signal, corresponding to the electrons, emitted from the wafer and actually received by the detector 19. The signal is routed to a controller 21 via a converter circuit 19a. The converter circuit 19a includes an analog-to-digital (A/D) converter that converts the signals from the BSE detector 19 to corresponding digital signals that can be processed by the controller 21. The relative positions of beam-test marks on the wafer 15 can be determined by processing the signal from the BSE detector, thereby allowing determinations of alignment between the wafer 15 and the electron-optical system or between the wafer 15 and the reticle 10. These signals are also used for determining beam drift, as discussed further below.

The wafer 15 is mounted, desirably using an electrostatic chuck 16, to a wafer stage 17 that is movable in X- and Y-directions. By appropriately moving the wafer stage 17 synchronously with movements of the reticle stage 11, wide areas of the pattern as defined on the reticle 10 can be exposed sequentially onto the wafer 15. Due to the image-inversion imparted by the projection lenses 12, 14, the stage movements normally are in opposite directions relative to each other. The respective positions of the stages 11, 17 in the X-and Y-directions are determined very accurately using laser interferometers (not shown, but as known in the art).

The various lenses 2, 3, 9, 12 and deflectors 5, 8, 13 are controlled by the controller 21 via respective coil power supplies 2a, 3a, 9a, 12a, and 5a, 8a, and 13a connected to the controller 21. In addition, the reticle stage 11 and wafer stage 17 are controlled by the controller 21 via stage drivers 11a and 17a, respectively, connected to the controller 21. Finally, the electrostatic chuck 16 is controlled by the main controller 21 via a chuck driver 16a connected to the controller 21. Thus, the respective positions of the stages and respective energizations of the lenses and deflectors are accurately controlled to allow demagnified images of the subfields on the reticle 10 to be stitched together accurately on the wafer 15, thereby forming one or more entire chip patterns on respective regions of the wafer.

The controller 21 includes a beam-drift correction unit 21a that includes a memory in which a table of beam-drift data obtained as described below can be stored. Based on data recalled from the table, the beam-drift correction unit 21a generates an appropriate beam-position correction signal and routes the signal to the deflector power supply 13a.

Figure 5A:
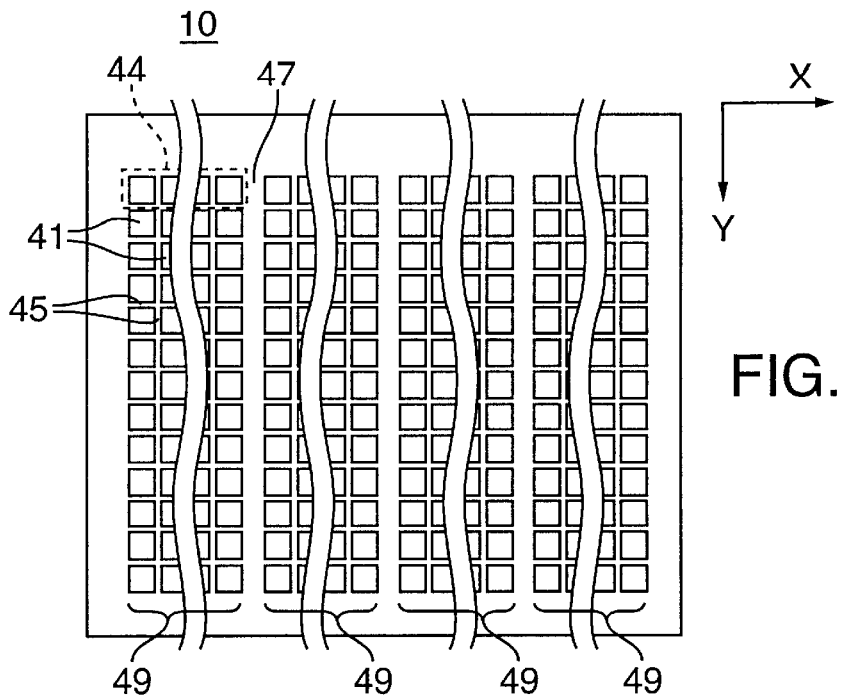
Figure 5B:
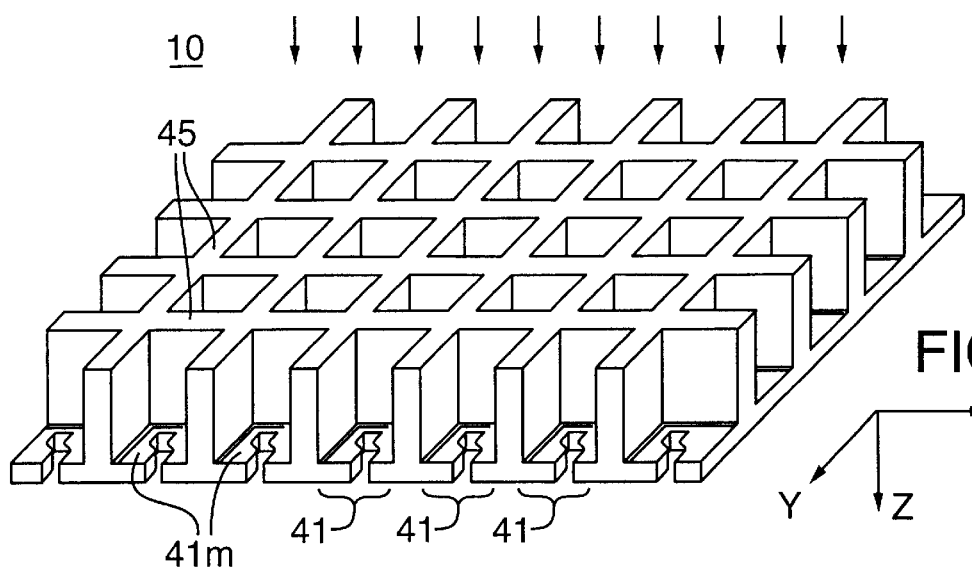
Figure 5C:
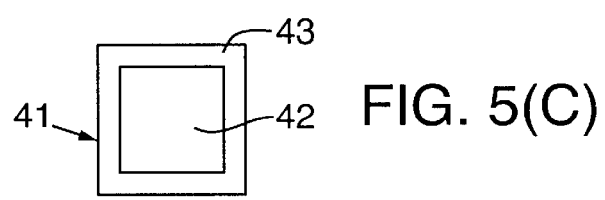

Details of an exemplary reticle 10 as used in the FIG. 4 apparatus are shown in FIGS. 5(A)–5(C). In FIG. 5(A), the reticle 10 comprises multiple "stripes" 49 each containing multiple rows of subfields 41. The rows each extend in the X-direction (representing the width dimension of the corresponding stripes), and the array of rows in each stripe 49 extends in the Y-direction (representing the length dimension of the corresponding stripe). Each row of subfields is termed a "deflection field" 44 because the length of the row (in the X-direction) corresponds to the maximum deflection range (in the X-direction) of the illumination beam as achieved by the subfield-deflection deflector 8 in the illumination-optical system.

As shown in FIG. 5(B), each subfield 41 comprises a respective membrane region 41m. The thickness (Z-dimension) of each membrane region 41m is 0.1 µm to several µm. As shown in FIG. 5(C), each subfield 41 comprises a respective patterned region 42 surrounded by a skirt 43 that lacks any pattern features. The patterned region 42 defines the features of the respective portion of the overall pattern defined by the reticle 10. During illumination of a subfield 41, the respective patterned region 42 is illuminated by the illumination beam, wherein the edges of the illumination beam fall within the respective skirt 43.

The patterned region 42 of each subfield 41 on the reticle 10 typically has an area (extending in the X- and Y-directions) of approximately 0.5 mm to 5 mm square. At a demagnification ratio of ⅕, the size of the corresponding image of the subfield as projected onto the wafer 15 is 0.1 mm to 1 mm square.

The reticle includes a grid-like "grillage" 45 comprising intersecting struts that surround each subfield 41. The reticle 10 includes grillage 45 because the membrane regions 41m are too thin to provide the reticle 10 with any substantial rigidity. Each strut is approximately 0.5 mm to 1 mm thick (in the Z-direction) and approximately 0.1 mm wide in the respective X- or Y-direction.

Referring further to FIG. 5(A), multiple stripes 49 are arrayed in the X-direction on the reticle 10. Between adjacent stripes 49 and around the perimeter of the reticle 10 are wide struts 47 that provide additional rigidity to the reticle 10. A wide strut 47 situated between adjacent stripes 49 is typically several mm wide (in the X-direction) and has the same thickness (in the Z-direction) as a regular strut located between adjacent subfields 41.

Reticles also can be used in which no non-patterned regions (regular struts and skirts 43) exist between adjacent subfields 41 in each deflection field 44. I.e., in such a reticle (and referring to FIGS. 5(A) and 5(C)), the patterned regions 42 of adjacent subfields 41 are contiguous within each deflection field 44 of each stripe 49.

Using an apparatus as shown in FIG. 4 and a reticle as shown in FIG. 5(A) for projection-exposure of the pattern defined on the reticle 10, the subfields 41 in each deflection field 44 are exposed sequentially by appropriately deflecting the electron beam in the X-direction. As each deflection field 44 is exposed, the next deflection field 44 is moved into position for exposure by appropriately moving (in a scanning manner) the reticle stage 11 and the wafer stage 17. (The stages 11, 17 are moved in opposite directions in the Y-direction.) After completing exposure of a stripe 49, the next stripe 49 is moved into position for exposure by appropriately moving (in a start-and-stop manner) the reticle stage 11 and the wafer stage 17. (The stages 11, 17 are moved in opposite directions in the X-direction.)

As each subfield 41 is projection-exposed onto the wafer 15, the non-patterned portions (skirts 43 and grillage 45) are "canceled" on the wafer so as to place the images of the patterned regions 42 contiguously with each other on the wafer 17. Such placement of the images of the patterned regions 42 on the wafer is termed "stitching" of the images. Upon completing exposure of the entire reticle 11, the corresponding image of a layer of a chip on the wafer comprises all the individual images of the patterned regions 42 stitched together. At a demagnification ratio of ¼ or ⅕, a chip size of 27 mm×44 mm on the wafer (the size of a 4-Gigabit DRAM) would require a reticle measuring (including subfields and non-patterned areas) 120×150 mm to 230×350 mm.

Figure 2:
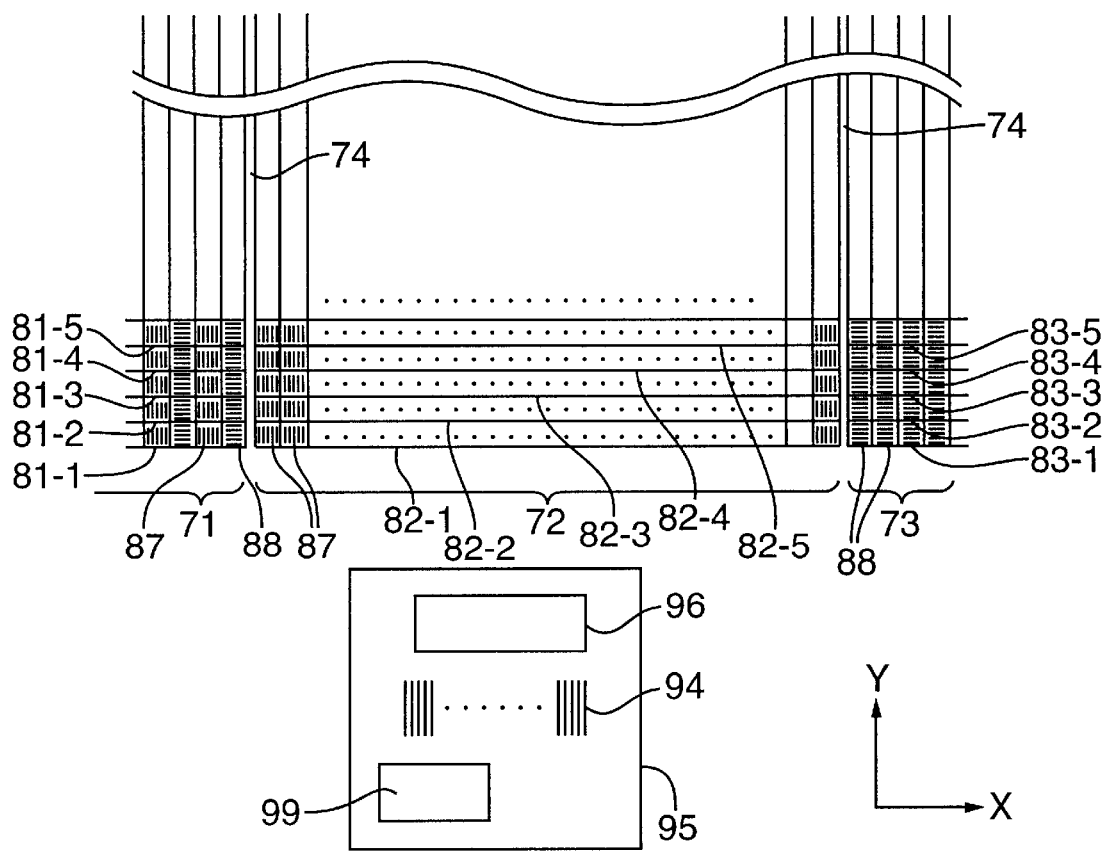
FIG. 2 is a schematic plan view of a representative disposition of beam-drift test patterns on a reticle (e.g., test reticle) according to the invention. The beam-drift test patterns are situated in certain deflection fields at the termini of certain stripes of the reticle.
Figure 3:
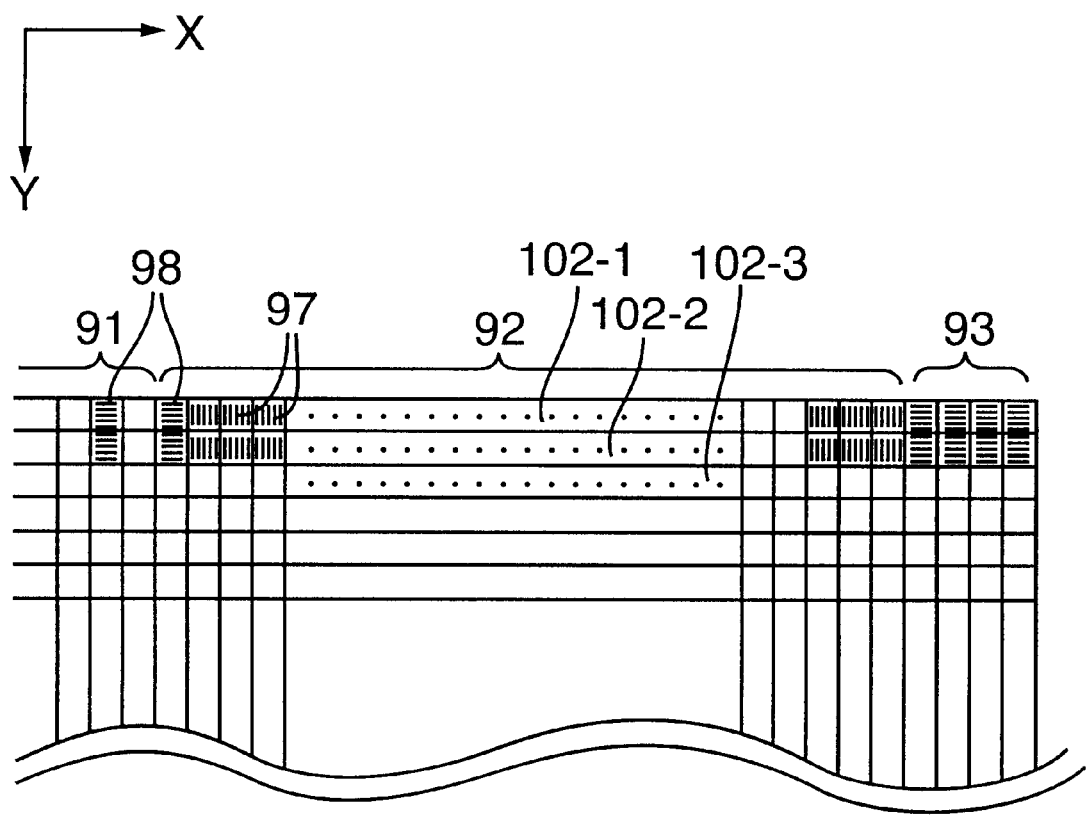
FIG. 3 is a schematic plan view of the disposition of corresponding beam-test marks on a substrate (e.g., test wafer) used with the reticle of FIG. 2.

FIG. 2 schematically depicts the disposition of beam-drift test patterns on a reticle (e.g., test reticle) according to the invention (and usable with the FIG. 4 apparatus). FIG. 3 schematically depicts the disposition of corresponding beam-test marks on a wafer (e.g., test wafer) used with the reticle of FIG. 2.

In FIG. 2, three stripes 71, 72, 73 are shown arrayed side-by-side in the X-direction. A wide strut 74 is situated between each pair of adjacent stripes 71, 72, 73. The stripe 71 is divided into deflection fields 81; the stripe 72 is divided into deflection fields 82, and the stripe 73 is divided into deflection fields 83. In each stripe 71, 72, 73, the respective deflection fields 81, 82, 83 are arrayed serially in the Y direction. In each deflection field, the constituent subfields are array serially in the X-direction. In FIG. 2, non-patterned regions (grillage 45 and skirts) are not shown so as to eliminate detail not needed for the following discussion.

In this example, the stripe 71 comprises deflection fields 81-1 through 81-5, the stripe 72 comprises deflection fields 82-1 through 82-5, and the stripe 73 comprises deflection fields 83-1 through 83-5. Each of these deflection fields includes beam-drift test patterns 87, 88. So-called "X-direction beam-drift test patterns" 87 include linear features extending in the Y-direction and arrayed serially in the X-direction, and so-called "Y-direction beam-drift test patterns" 88 include linear features extending in the Z-direction and arrayed serially in the Y-direction. Deflection fields containing the beam-drift test patterns 87, 88 are situated at the ends (in the Y-direction) of each stripe 71, 72, 73. In this example, although only five are shown, up to approximately ten sets of deflection fields that include these beam-drift test patterns can be disposed at the end of each stripe.

Each linear feature of a beam-drift test pattern 87, 88 is a respective area on the reticle that is readily transmissive to the illumination beam. Examples of such areas are voids or regions of the reticle membrane that exhibit low scattering. The corresponding beam-test marks 97, 98 on the wafer (FIG. 3; the beam-test marks 97, 98 have linear features corresponding to the linear features in the beam-drift test patterns 87, 88) desirably are defined by a metallic layer or the like that is highly reflective to the charged particles in the beam.

Figure 1:
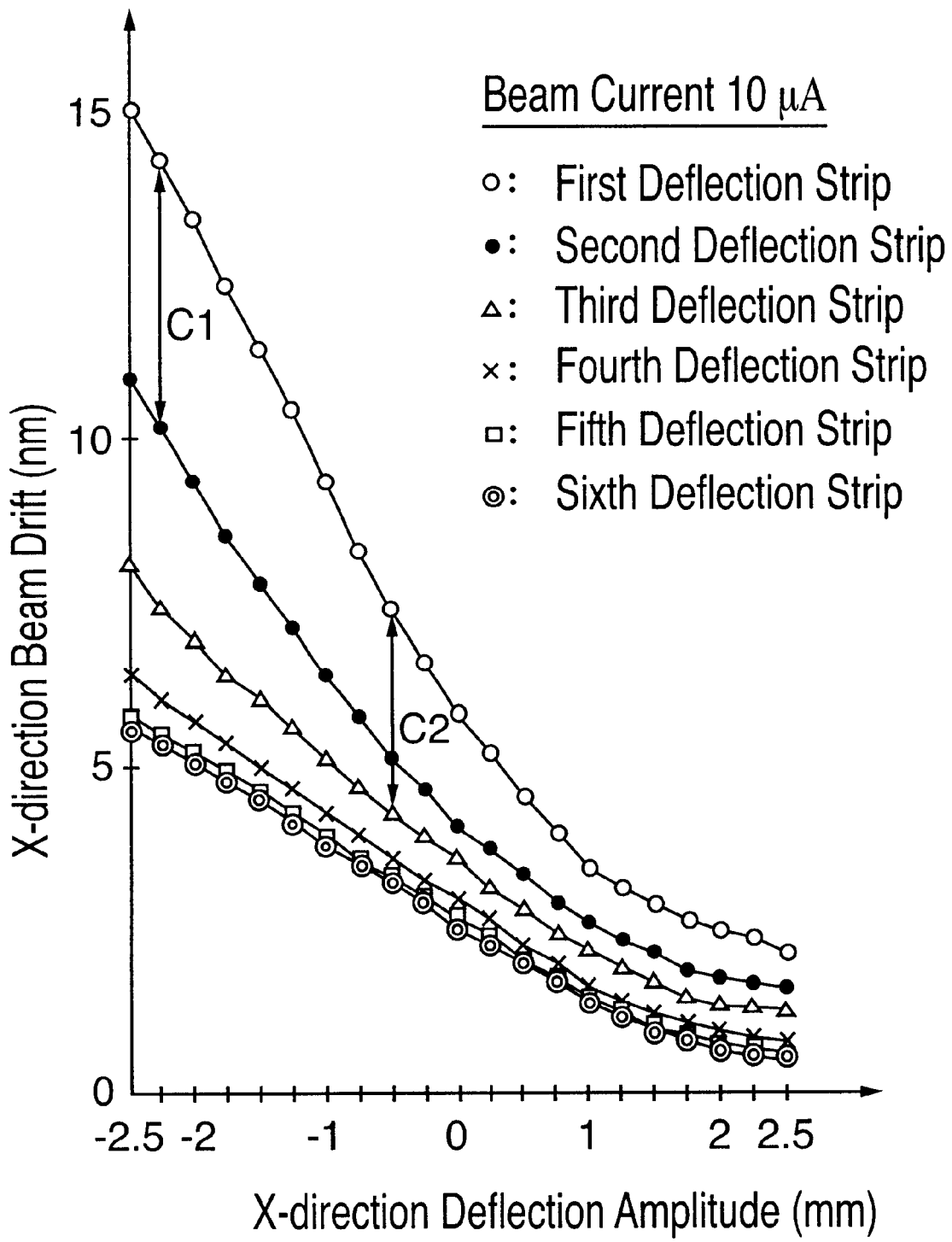
FIG. 1 is a graph showing an example of beam-drift measurement results as used for determining beam-drift correction according to the invention. The vertical axis is beam drift in the X-direction (unit=mm), and the horizontal axis is amplitude by which the beam is deflected in the X-direction (unit=mm).

In FIG. 2, by way of example, the deflection fields 82 in the middle stripe 72 only have X-direction beam-drift test patterns 87, whereas the deflection fields 83 in the right-hand stripe 73 only have Y-direction beam-drift test patterns 88. Providing both X-direction test patterns and Y-direction test patterns allows beam-drift data to be obtained for both the X-direction and the Y-direction. The deflection fields 81 in the left-hand stripe 71 include subfields alternately containing X-direction test patterns 87 and Y-direction test patterns 88. Other combinations of the beam-drift test patterns 87, 88 can be selected as appropriate. Different combinations allow more flexibility in obtaining beam-drift data at various magnitudes of beam deflection in both the X- and Y-directions. For example, if beam drift in the Y-direction is relatively small, then the beam-drift test patterns in the stripe 82 are usually sufficient (for testing the beam drift in the X-direction). The beam-drift test patterns in the stripe 81 are sufficient if a plot of beam drift versus magnitude of beam deflection (such as shown in FIG. 1) is a smooth curve.

Corresponding to the beam-drift test patterns 87, 88 in FIG. 2, deflection fields with multiple beam-test marks 97, 98 are formed on the wafer shown in FIG. 3. However, on the wafer, there are no components situated between the stripes 91, 92, 93 that correspond to the wide struts situated between the stripes 71, 72, 73 on the reticle. Rather, on the wafer, the stripes 91, 92, 93 are joined together contiguously.

Also, non-patterned regions located on the reticle between adjacent subfields and deflection fields are not formed on the wafer. Thus, on the wafer, the entire reticle pattern is formed with all the constituent pattern-portion-defining subfields, deflection fields, and stripes being stitched together.

In this example, the width and length of the linear test-pattern features are pre-determined so that the beam current at a subfield defining only the linear test-pattern features is 1 $\mu$A. In cases where the beam current is larger, relatively large voids 96, 99 can be defined in areas of the subfield aside from where the test patterns 94 exist, as shown in the enlarged view of a subfield 95 shown in FIG. 2. For example, beam drift can be measured at beam currents of 5 $\mu$A, 10 $\mu$A, 15 $\mu$A, 20 $\mu$A, and 25 $\mu$A, etc., to ascertain the relationship between beam current and beam drift. Now, in this case, the illumination-beam current incident to a single subfield on the reticle is 100 $\mu$A.

FIG. 1 is a graph showing an example of beam-drift measurement results and of determining and applying a corresponding amount of beam-drift correction. In this example, the beam current is 10 $\mu$A. The ordinate (vertical axis) is magnitude of beam drift in the X-direction, and the abscissa (horizontal axis) is beam-drift in the X-direction (unit=nm). The curve defined by the open circles is of measured beam drift obtained by scanning the beam over the first deflection field 82-1 (FIG. 2, corresponding to the deflection field 102-1 in FIG. 3) in the Y-direction and detecting the test-pattern positions. The curve defined by the black (closed) circles is of measured beam drift obtained by scanning the beam over the second deflection field 82-2 in the Y-direction and detecting the test-pattern positions. The curve defined by the triangles is of measured beam drift obtained by scanning the beam over the third deflection field 82-3 in the Y-direction and detecting the test-pattern positions. The curve defined by the x's is of measured beam drift obtained by scanning the beam over the fourth deflection field 82-4 in the Y-direction and detecting the test-pattern positions. The curve defined by the open squares is of measured beam drift obtained by scanning the beam over the fifth deflection field 82-5 in the Y-direction and detecting the test-pattern positions. Finally, the curve defined by the open double circles is of measured beam drift obtained by scanning the beam over a sixth deflection field in the Y-direction and detecting the test-pattern positions. When obtaining these data, the scanning rate and timing for beam blanking, etc., were the same as during actual device-pattern scanning.

In this example, since the measurements proceeded from the minus direction toward the plus direction over the respective deflection fields, the magnitude of drift in each curve was greater for X-direction beam deflection in the minus direction than for X-direction beam deflection in the plus direction. In addition, the magnitude of drift was relatively high in the first deflection field 82-1 and was progressively less in the second deflection field 82-2, third deflection field 82-3, and so on. Even though not shown in FIG. 1, respective magnitudes of beam drift as measured in deflection fields after the sixth deflection field were essentially the same as in the sixth deflection field. The relatively high magnitude of drift in the first deflection field of a stripe is due principally to de-energization of a blanking deflector after a relatively long period of beam blanking (as encountered while waiting for a change of stripes or the like).

In the example shown in FIG. 1, reproducibility is relatively good and the data points smoothly define the respective curves. In instances in which beam drift exhibits poor reproducibility, scattered points appear on the respective curves, wherein the points do not clearly define the respective curve. The corresponding data will exhibit poor convergence, regardless of the deflection field. Since drift correction is very difficult under such conditions, equipment maintenance is indicated, such as cleaning the interior of lenses in the illumination-optical system and/or projection-optical system of the pattern-transfer apparatus.

A representative method for correcting beam drift (based on the exemplary measurement results in FIG. 1) is now explained. During normal projection-exposure of a device pattern, the beam-drift test patterns can be disposed in the first deflection field in the Y-direction end of a stripe. That stripe is exposed while performing beam-drift correction based on the detection data obtained with the test patterns. If beam-drift correction were not to be performed, then correction for all the deflection fields in the particular stripe would be determined based on the measurement data obtained from the first deflection field.

In this example, the respective magnitudes of beam drift of other deflection fields relative to the first deflection field are known in advance from prior testing. The magnitudes of beam drift for each strip are tabulated, corresponding to the amplitude of beam deflection in the X30 direction, in as memory in the beam-drift correction unit 21a. For example, if the amplitude of beam deflection for the second deflection field were −2.25 mm, then the value (4 nm) denoted by "C1" in FIG. 1 would correspond to the drift magnitude. If the amplitude of beam deflection for the third deflection field were −0.5 mm, then the value (3 nm) denoted by "C2" in FIG. 1 would correspond to the drift magnitude. These values are tabulated and stored in the beam-drift-correction unit 21a (FIG. 4).

Afterward, when an actual device pattern is projection-exposed onto a wafer, the magnitude of beam drift corresponding to the respective deflection amplitude for each stripe is corrected according to test-pattern-position data obtained at the first deflection field of the stripe. Thus, the subfield-transfer position in each deflection field is corrected.

The table in the foregoing example was created using difference values. However, a table alternatively can be created using ratios of beam-drift magnitude in a second deflection field to beam-drift magnitude in a first deflection field. For example, if the deflection amplitude for the second defection field were −2.25 mm, then the value of the beam-position drift ratio would be (10 nm)/(14 nm)=0.71, wherein 10 nm is the magnitude of beam drift in the second deflection field and 14 nm is the magnitude of beam drift in the first deflection field (see line "C1" in FIG. 1). According to this ratio, the beam position is corrected and actual exposure is made.

A table can be created for each magnitude of beam current; for example, six tables can be created. Then, the magnitude of drift correction is calculated according to the average beam current at the level of the actual device pattern. The required correction to the median beam current can be determined by interpolation. In such a manner, the magnitude of beam-position correction is calculated taking into account the beam current and other variables, based on magnitudes of beam drift previously determined. Beam position is corrected by the determined magnitude.

Correction in the Y-direction is measured in a manner similar to that described above regarding the X-direction. Also, the data are similarly tabulated and used to perform correction. Correction in the Y-direction desirably is performed together with correction in the X-direction. (Beam drift in the Y-direction is normally less than beam drift in the X-direction.)

Measurements as shown in FIG. 1 desirably are performed on a periodic basis. Under such conditions, if the magnitudes of beam drift are not observed to converge around a constant value in five or six attempts, as described above (or if variances of over 2 nm occur in the data even as they approach a constant magnitude of beam drift at the end of the deflection field), then it can be concluded that a non-reproducible variable is causing the beam drift. Cleaning of the apparatus is required.

As is clear from the foregoing, this invention provides methods and apparatus for achieving high-accuracy and high-precision pattern transfer, even when a certain amount of beam drift is evident.

Figure 6:
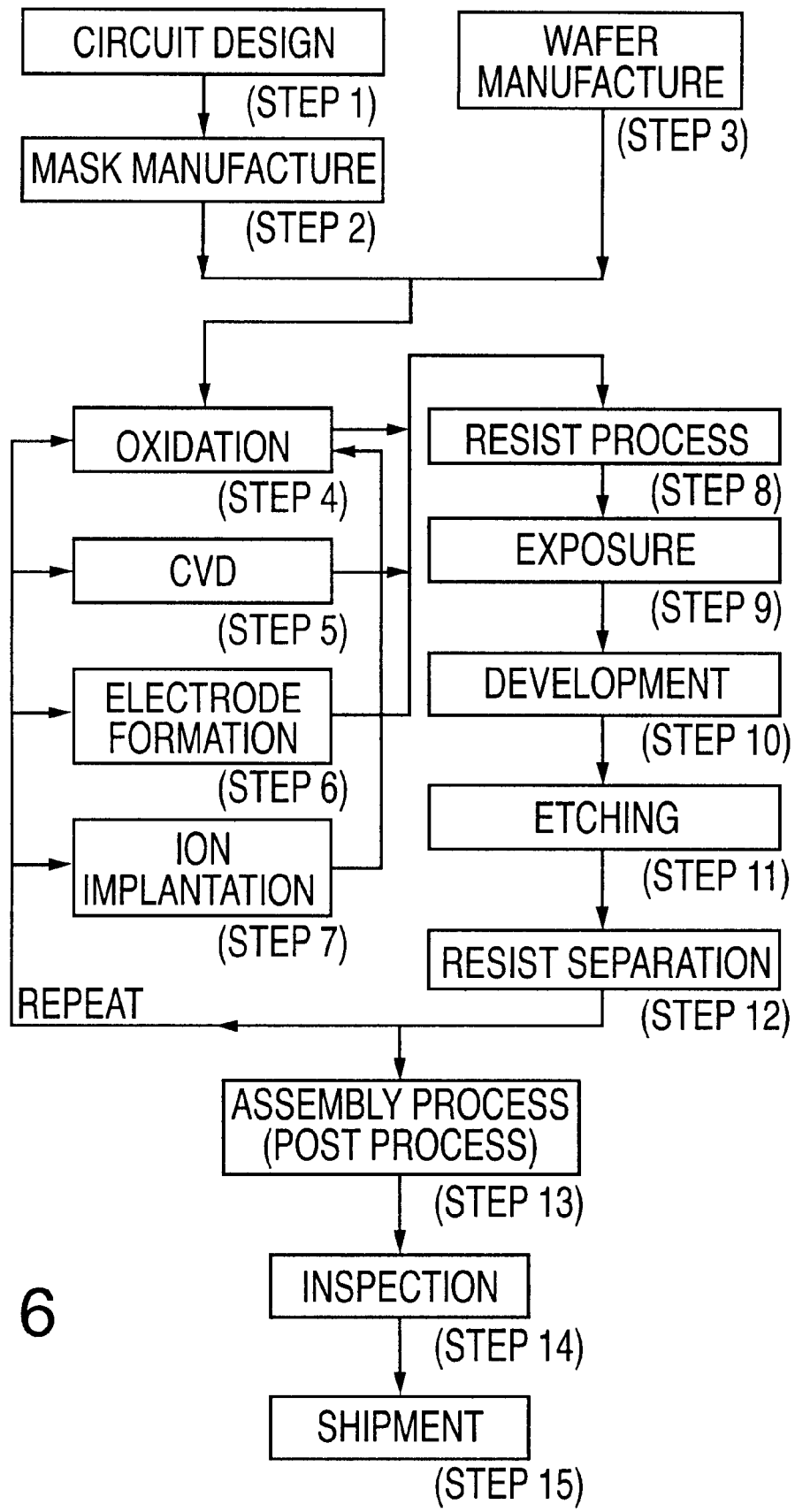
FIG. 6 is a flow chart of steps in a process for manufacturing a semiconductor device such as a semiconductor chip.

FIG. 6 is a flow chart of steps in a process for manufacturing a semiconductor device such as a semiconductor chip (e.g., an integrated circuit or LSI device), a display panel (e.g., liquid-crystal panel), or CCD, for example. In step 1, the circuit for the device is designed. In step 2, a reticle ("mask") for the circuit is manufactured. In step 3, a wafer is manufactured from a material such as silicon.

Steps 4–12 are directed to wafer-processing steps, specifically "pre-process" steps. In the pre-process steps, the circuit pattern defined on the reticle is transferred onto the wafer by microlithography. Step 13 is an assembly step (also termed a "post-process" step) in which the wafer that has been passed through steps 4–12 is formed into semiconductor chips. This step can include, e.g., assembling the devices (dicing and bonding) and packaging (encapsulation of individual chips).

Step 14 is an inspection step in which any of various operability and qualification tests of the device produced in step 13 are conducted. Afterward, devices that successfully pass step 14 are finished, packaged, and shipped (step 16).

Steps 4–12 also provide representative details of wafer processing. Step 4 is an oxidation step for oxidizing the surface of a wafer. Step 5 involves chemical vapor deposition (CVD) for forming an insulating film on the wafer surface. Step 6 is an electrode-forming step for forming electrodes on the wafer (typically by vapor deposition). Step 7 is an ionimplantation step for implanting ions (e.g., dopant ions) into the wafer. Step 8 involves application of a resist (exposure-sensitive material) to the wafer. Step 9 involves microlithographically exposing the resist so as to imprint the resist with the reticle pattern, as described elsewhere herein. Step 10 involves developing the exposed resist on the wafer. Step 11 involves etching the wafer to remove material from areas where developed resist is absent. Step 12 involves resist separation, in which remaining resist on the wafer is removed after the etching step. By repeating steps 4–12 as required, circuit patterns as defined by successive reticles are superposedly formed on the wafer.

Whereas the invention has been described in connection with example embodiments, it will be understood that the invention is not limited to those embodiments. On the contrary, the invention is intended to encompass all alternatives, modifications, and equivalents as may be included within the spirit and scope of the invention, as defined by the appended claims.

What is claimed is:

1. In a charged-particle-beam (CPB) microlithography method in which a charged particle beam is used to transfer a pattern, defined in a pattern-transfer field on a reticle, onto a sensitive substrate by passing the beam through selected regions of the pattern and through a CPB optical system to the sensitive substrate so as to imprint the substrate with the pattern, a method for measuring beam drift, the method comprising the steps:

(a) dividing the pattern-transfer field into multiple stripes and each stripe into multiple deflection fields, wherein each deflection field has a length corresponding to a width dimension of the respective stripe and to a beam-deflection range of the CPB optical system;

(b) disposing multiple beam-drift test patterns in one or more deflection fields located at an end of a stripe, wherein any of the beam-drift test patterns forms the charged particle beam into a test-pattern-detection beam whenever the charged particle beam passes through the beam-drift test pattern;

(c) disposing corresponding beam-test marks in regions on the substrate corresponding to the one or more deflection fields on the reticle containing the beam-drift test patterns, such that the pattern-detection beam passing through a beam-drift test pattern on the reticle can impinge on a corresponding beam-test mark on the substrate;

(d) passing the charged particle beam through the beam-drift test patterns on the reticle to form the pattern-detection beam, and scanning the pattern-detection beam over the corresponding beam-test marks on the substrate;

(e) detecting charged particles emitted from the beam-test marks on the substrate produced by impingement of the pattern-detection beam on the beam-test marks so as to obtain data corresponding to beam drift experienced during the scanning; and (f) from the data, obtaining a measurement of beam drift.

2. The method of claim 1, further comprising the steps:

from the measurement, calculating an amount of beam-drift correction to be applied to the charged particle beam so as to at least reduce displacement of an image, as projected onto the substrate, caused by the beam drift; and applying the beam-drift correction to the charged particle beam as the pattern is being transferred, using the charged particle beam, from the reticle to the substrate.

3. The method of claim 1, wherein:

in step (d), the pattern-detection beam is scanned multiple times through the beam-drift test patterns on the reticle and over the corresponding beam-test marks on the substrate; and the positions of the beam-test patterns are detected multiple times.

4. The method of claim 1, wherein the pattern transfer field is transferred from the reticle to the substrate by deflecting and scanning the charged particle beam in a width dimension of each stripe to expose each deflection field, while synchronously moving the reticle and substrate in a length dimension of each stripe, the method further comprising the steps:

from the measurement, calculating an amount of beam-drift correction to be applied to the charged particle beam so as to at least reduce a pattern displacement, as projected onto the substrate, caused by the beam drift; and applying the beam-drift correction to the charged particle beam as the pattern is being transferred, using the charged particle beam, from the reticle to the substrate.

5. The method of claim 1, further comprising the steps:

disposing the beam-drift test patterns in multiple deflection fields at a lengthwise end of a stripe; and disposing the corresponding beam-test marks in multiple regions on the substrate corresponding to the deflection fields on the reticle.

6. The method of claim 5, further comprising the step of scanning the beam-drift test patterns on the reticle with the charged particle beam at a scanning rate equal to a beam-scanning rate used when transferring the pattern to the reticle.

7. The method of claim 6, further comprising the steps of:

detecting a respective amount of beam drift for each deflection field;

from each detected beam drift, calculating a corresponding amount of correction to be applied to beam position as incident on the substrate; and correcting the beam position for each deflection field during pattern transfer based on the detected amount of beam drift.

8. The method of claim 1, further comprising the steps:

defining the beam-drift test patterns on a test reticle comprising multiple deflection fields each comprising multiple subfields containing a beam-drift test pattern;

defining the corresponding beam-test marks on a test substrate comprising multiple regions each corresponding to a respective deflection field on the reticle, each region encompassing multiple subfields containing a beam-drift test pattern;

before exposing the pattern, defined on the reticle, onto the substrate, scanning the charged particle beam through the beam-drift test patterns on the test reticle onto the corresponding beam-test marks on the test substrate to obtain a measurement of beam drift exhibited by each deflection field; and exposing the pattern, defined on the reticle, onto the substrate while correcting beam drift based on the measurements.

9. The method of claim 1, wherein each deflection field containing a beam-drift test pattern has an average feature density equal to an average feature density of the pattern.

10. The method of claim 1, further comprising the step, whenever measured beam drift exceeds a predetermined value, of cleaning components of the CPB optical system.

11. The method of claim 2, further comprising the steps of:

determining whether the measured beam drift is repeatable or non-repeatable;

if the measured beam drift is repeatable, then correcting beam position based on the measured beam drift, while exposing the pattern; and if the measured beam drift is non-repeatable and exceeds a predetermined value, then performing maintenance on the CPB optical system to reduce the beam drift.

12. A segmented reticle for use in charged-particle-beam microlithography, comprising:

a pattern field divided into multiple stripes each having a width dimension and a length dimension, each stripe being divided into multiple deflection fields each having a length extending in the width dimension of the respective stripe; and at least one stripe including multiple deflection fields, located at a lengthwise end of the stripe, each comprising multiple beam-drift test patterns arrayed in the respective deflection fields.

13. The reticle of claim 12, wherein:

the reticle extends in X- and Y-directions;

the beam-drift test patterns include X-direction test patterns and Y-direction test patterns.

14. The reticle of claim 13, wherein:

each X-direction test pattern comprises pattern features that linearly extend in the Y-direction and are serially arrayed in the X-direction; and each Y-direction test pattern comprises pattern features that linearly extend in the X-direction and are serially arrayed in the Y-direction.

15. The reticle of claim 12, wherein:

each deflection field comprises multiple subfields;

deflection fields that include beam-drift test patterns include multiple subfields each defining a beam-drift test pattern.

16. The reticle of claim 15, wherein a deflection field in a stripe contains at least one X-direction test pattern and at least one Y-direction test pattern.

17. An apparatus for performing microlithography using a charged particle beam as an energy beam to transfer a pattern, defined by a segmented reticle, to a sensitive substrate, the apparatus comprising:

an illumination-optical system situated and configured to direct a charged particle beam from a source to illuminate a specified region on the reticle, the illumination-optical system comprising a subfield-selection deflector;

a movable reticle stage on which the reticle can be mounted;

a projection-optical system situated and configured to project and form an image, of the illuminated region on the reticle and carried by the charged particle beam passing through the illuminated region of the reticle, on a corresponding region on the substrate;

a movable substrate stage on which the sensitive substrate can be mounted;

a reticle mountable on the reticle stage, the reticle having a pattern-transfer field divided into multiple stripes each having a length dimension, a width dimension, and a lengthwise end, each stripe being divided into multiple deflection fields, the deflection fields having a length extending in the width dimension of the respective stripe and representing a beam-deflection range of the subfield-selection deflector in the illumination-optical system, at least one stripe including multiple deflection fields situated on its lengthwise end and comprising multiple beam-drift test patterns that can be scanned by the illumination beam;

a substrate mountable on the substrate stage, the substrate having respective regions corresponding to the stripes and deflection fields of the reticle, at least one region corresponding to a stripe including multiple regions corresponding to the deflection fields that contain beam-test marks that can be scanned by the charged particle beam passing through the corresponding beam-drift test pattern on the reticle;

a controller connected to the subfield-selection deflector and configured to cause the subfield-selection deflector to deflect the illumination beam to scan the deflection fields of the reticle, mounted on the reticle stage, in the width dimension of the stripes and meanwhile to cause the reticle stage and substrate stage to move the reticle and substrate, respectively, in opposite directions along the length dimension of the stripes, so as to transfer the pattern to the substrate; and a detector connected to the controller and configured to detect charged particles propagating from the beam-test marks on the substrate as the beam-test marks are being scanned by the charged particle beam passing through the corresponding beam-drift test patterns on the reticle, so as to detect beam drift, wherein signals from the detector are used by the controller in calculations of an amount of beam-position correction that is required based on the detected beam drift.

18. The apparatus of claim 17, further comprising a beam-drift correction unit connected to the controller and configured to detect, before performing pattern transfer, positions of the beam-drift test patterns multiple times by scanning the beam-drift test patterns on the reticle and the corresponding beam-test marks on the substrate with the charged particle beam, the beam-drift correction unit comprising a memory configured to store data concerning beam drift for later recall and use by the beam-drift-correction unit in calculations of the amount of beam-position correction required to reduce beam drift.

19. A process for manufacturing a semiconductor device, comprising the steps:

(a) preparing a wafer;

(b) processing the wafer; and (c) assembling devices formed on the wafer during steps (a) and (b), wherein step (b) comprises the steps of (i) applying a resist to the wafer; (ii) exposing the resist; (iii) developing the resist; and (iv) annealing the resist; and step (ii) comprises providing a charged-particle-beam projection-exposure system as recited in claim 17; and using the charged-particle-beam projection-exposure apparatus to expose the resist with the pattern defined on the reticle.

20. A semiconductor device produced by the method of claim 19.

21. A method for manufacturing a semiconductor device, comprising:

(a) providing a reticle defining a pattern;

(b) preparing a wafer, including applying a layer of resist to the wafer, so as to render the wafer imprintable with the pattern;

(c) exposing the wafer with the reticle pattern so as to imprint the wafer with the pattern, while controlling beam drift according to a method as recited in claim 1;

(d) developing and selectively etching the imprinted wafer;

(e) removing remaining resist from the wafer; and (f) repeating steps (a)–(e) as required to manufacture the device.

* * * * *

UNITED STATES PATENT AND TRADEMARK OFFICE
CERTIFICATE OF CORRECTION

PATENT NO. : 6,352,799 B1
DATED : March 5, 2002
INVENTOR(S) : Mamoru Nakasuji

It is certified that error appears in the above-identified patent and that said Letters Patent is hereby corrected as shown below:

Column 2,
Line 22, "CPB)" should be -- (CPB) --.

Column 6,
Line 9, "socalled" should be -- so-called --.

Column 7,
Line 6, "wafer 15." should be -- wafer 15). --.

Column 9,
Line 12, "array" should be -- arrayed --.

Column 11,
Line 22, "X30 direction" should be -- X-direction --.

Signed and Sealed this

Sixth Day of April, 2004

JON W. DUDAS
*Acting Director of the United States Patent and Trademark Office*